US009981286B2

(12) United States Patent
Woodruff et al.

(10) Patent No.: US 9,981,286 B2
(45) Date of Patent: May 29, 2018

(54) SELECTIVE FORMATION OF METAL SILICIDES

(71) Applicant: ASM IP HOLDING B.V., Almere (NL)

(72) Inventors: Jacob Huffman Woodruff, Scottsdale, AZ (US); Michael Eugene Givens, Phoenix, AZ (US); Bed Sharma, Gilbert, AZ (US); Petri Räisänen, Gilbert, AZ (US)

(73) Assignee: ASM IP HOLDING B.V., Almere (NL)

( * ) Notice: Subject to any disclaimer, the term of this patent is extended or adjusted under 35 U.S.C. 154(b) by 229 days.

(21) Appl. No.: 15/064,404

(22) Filed: Mar. 8, 2016

(65) Prior Publication Data
US 2017/0259298 A1 Sep. 14, 2017

(51) Int. Cl.
C23C 16/42 (2006.01)
B05D 1/00 (2006.01)

(52) U.S. Cl.
CPC ............ B05D 1/60 (2013.01); *B05D 2203/30* (2013.01)

(58) Field of Classification Search
CPC ......... C23C 16/42; C23C 16/30; C23C 16/40; C23C 16/06; C23C 16/08; C23C 16/34
See application file for complete search history.

(56) References Cited

U.S. PATENT DOCUMENTS

| 4,863,879 | A | 9/1989 | Kwok |
| 4,948,755 | A | 8/1990 | Mo |
| 5,447,887 | A | 9/1995 | Filipiak et al. |
| 5,633,036 | A | 5/1997 | Seebauer et al. |
| 5,869,135 | A | 2/1999 | Vaeth et al. |
| 5,925,494 | A | 7/1999 | Horn |
| 6,046,108 | A | 4/2000 | Liu et al. |
| 6,482,740 | B2 | 11/2002 | Soininen et al. |
| 6,586,330 | B1 | 7/2003 | Ludviksson et al. |
| 6,679,951 | B2 | 1/2004 | Soininen et al. |
| 6,759,325 | B2 | 7/2004 | Raaijmakers et al. |
| 6,811,448 | B1 * | 11/2004 | Paton ................ H01L 21/02046 257/E21.165 |
| 6,844,258 | B1 | 1/2005 | Fair et al. |
| 6,878,628 | B2 | 4/2005 | Sophie et al. |

(Continued)

FOREIGN PATENT DOCUMENTS

EP 0469456 A1 2/1992
EP 0880168 A2 11/1998
(Continued)

OTHER PUBLICATIONS

Lemonds, A.M., et al., "Atomic layer deposition of TaSix thin films on SiO2 using TaF5 and Si2H6". Thin Solid Films, 488 (2005) 9-14.*

(Continued)

*Primary Examiner* — Bret P Chen
(74) *Attorney, Agent, or Firm* — Knobbe, Martens, Olson & Bear LLP

(57) ABSTRACT

Processes are provided for selectively depositing a metal silicide material on a first H-terminated surface of a substrate relative to a second, different surface of the same substrate. In some aspects, methods of forming a metal silicide contact layer for use in integrated circuit fabrication are provided.

21 Claims, 7 Drawing Sheets

(56) References Cited

U.S. PATENT DOCUMENTS

| | | | |
|---|---|---|---|
| 6,887,795 B2 | 5/2005 | Soininen et al. |
| 6,921,712 B2 | 7/2005 | Soininen et al. |
| 6,958,174 B1 | 10/2005 | Klaus et al. |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,754,621 B2 | 7/2010 | Putkonen |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,955,979 B2 | 6/2011 | Kostamo et al. |
| 7,964,505 B2 | 6/2011 | Khandelwal et al. |
| 8,293,597 B2 | 10/2012 | Raaijmakers |
| 8,293,658 B2 | 10/2012 | Shero et al. |
| 8,425,739 B1 | 4/2013 | Wieting |
| 8,536,058 B2 | 9/2013 | Kostamo et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,980,418 B2 | 3/2015 | Darling et al. |
| 8,993,404 B2 | 3/2015 | Kobrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,236,292 B2 | 1/2016 | Romero |
| 9,257,303 B2 | 2/2016 | Haukka et al. |
| 9,490,145 B2 | 11/2016 | Niskanen et al. |
| 9,502,289 B2 | 11/2016 | Haukka et al. |
| 9,911,595 B1 | 3/2018 | Smith et al. |
| 2001/0019803 A1 | 9/2001 | Mirkanimi |
| 2001/0025205 A1 | 9/2001 | Chern et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0181035 A1 | 9/2003 | Yoon et al. |
| 2004/0219746 A1 | 7/2004 | Vaartstra et al. |
| 2005/0136604 A1 | 6/2005 | Al-Bayati et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0141155 A1 | 6/2006 | Gordon et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0063317 A1* | 3/2007 | Kim .................. G03F 7/70633 257/622 |
| 2007/0099422 A1 | 5/2007 | Wijekoon et al. |
| 2007/0241390 A1 | 10/2007 | Tanaka et al. |
| 2008/0066680 A1 | 3/2008 | Sherman |
| 2008/0072819 A1 | 3/2008 | Rahtu |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0311879 A1 | 12/2009 | Blasco et al. |
| 2010/0015756 A1 | 1/2010 | Weidman et al. |
| 2010/0147396 A1 | 6/2010 | Yamagishi et al. |
| 2010/0248473 A1 | 9/2010 | Ishizaka et al. |
| 2010/0270626 A1 | 10/2010 | Raisanen |
| 2011/0053800 A1 | 3/2011 | Jung et al. |
| 2011/0124192 A1 | 5/2011 | Ganguli et al. |
| 2011/0221061 A1 | 9/2011 | Prakash |
| 2011/0311726 A1 | 12/2011 | Liu et al. |
| 2012/0032311 A1 | 2/2012 | Gates |
| 2012/0046421 A1 | 2/2012 | Darling et al. |
| 2012/0088369 A1 | 4/2012 | Weidman et al. |
| 2012/0189868 A1 | 7/2012 | Borovik et al. |
| 2012/0219824 A1 | 8/2012 | Prolier et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0089983 A1 | 4/2013 | Sugita et al. |
| 2013/0095664 A1 | 4/2013 | Matero et al. |
| 2013/0115768 A1 | 5/2013 | Pore et al. |
| 2013/0146881 A1 | 6/2013 | Yamazaki et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0316080 A1 | 11/2013 | Yamaguchi et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0273290 A1 | 9/2014 | Somervell |
| 2014/0273527 A1 | 9/2014 | Niskanen et al. |
| 2015/0004806 A1 | 1/2015 | Ndiege et al. |
| 2015/0011032 A1 | 1/2015 | Kunimatsu et al. |
| 2015/0037972 A1* | 2/2015 | Danek .................. C23G 5/00 438/643 |
| 2015/0064931 A1 | 3/2015 | Kumagi et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0299848 A1 | 10/2015 | Haukka et al. |
| 2015/0371866 A1 | 12/2015 | Chen et al. |
| 2015/0376211 A1 | 12/2015 | Girard et al. |
| 2016/0075884 A1 | 3/2016 | Chen |
| 2016/0186004 A1 | 6/2016 | Hustad et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0293398 A1 | 10/2016 | Danek et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0154806 A1 | 6/2017 | Wang et al. |
| 2017/0323776 A1 | 11/2017 | Färm et al. |

FOREIGN PATENT DOCUMENTS

| | | |
|---|---|---|
| EP | 1340269 | 2/2009 |
| JP | 2011-187583 | 9/2011 |
| JP | 2014-93331 | 5/2014 |
| KR | 102001001072 | 2/2001 |
| KR | 1020040056026 | 6/2004 |
| WO | WO 2002/045167 | 6/2002 |
| WO | WO 2011/156705 | 12/2011 |
| WO | WO 2014/156782 | 10/2014 |
| WO | WO 2014/209390 | 12/2014 |
| WO | WO 2015/047345 | 4/2015 |

(56) References Cited

FOREIGN PATENT DOCUMENTS

| WO | WO 2015/094305 | 6/2015 |
|---|---|---|
| WO | WO 2015/147843 | 10/2015 |
| WO | WO 2015/147858 | 10/2015 |

OTHER PUBLICATIONS

Bernal-Ramos, Karla, et al., "Atomic Layer Deposition of Cobalt Silicide Thin Films Studied by in Situ Infrared Spectroscopy". Chemistry of Materials, 2015, 27, 4943-4949.*
Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton, B.B. et al., "Atomic Layer Deposition of MgO Using Bis(ethylcyclopentadienyl)magnesium and H20". J. Phys. Chem. C, 2009, 113, 1939-1946.
Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Carlsson, J., "Precursor Design for Chemical Vapour Deposition", Acta Chemica Scandinavica, vol. 45, 1991, pp. 864-869.
Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.
Chen et al., Highly Stable Monolayer Resists for Atomic Layer Deposition on Germanium and Silicon, Chem. Matter, vol. 18, No. 16, pp. 3733-3741, 2006.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al. "Nucleation and growth during tungsten atomic layer deposition on SiO2 surfaces", Thin Solid Films, vol. 386, 2001 pp. 41-52.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly(methyl methacrylate) Films as Mask Layers, J. Phys. Chem. C, 2008, 112, pp. 15791-15795. (Year: 2008).
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
George, Steven M.; Atomic Layer Deposition: An Overview; Chem. Rev. 2010, 110, pp. 111-131; Steven M.; Atomic Layer Deposition: an Overview; Chem. Rev. 2010, 110, pp. 111-131; Feb. 12, 2009.
Ghosal et al., Controlling Atomic Layer Deposition of Ti02 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.

Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, Dielectric Barrier, Etch Stop, and Metal Capping Materials for State of the Art and beyond Metal Interconnects, ECS Journal of Solid State Science and Technology, vol. 4, Issue 1, pp. N3029-N3047, 2015.
Lee et al., Area-Selective Atomic Layor Deposition Using Self-Assembled Monolayer and Scanning Probe Lithography, Journal of the Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
Notice of Allowance dated Apr. 5, 2017 in U.S. Appl. No. 15/177,195.
Office Action dated Aug. 29, 2014 in U.S. Appl. No. 13/702,992.
Office Action dated Nov. 7, 2014 in U.S. Appl. No. 13/708,863.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, 29, Mar. 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.

(56) References Cited

OTHER PUBLICATIONS

Roberts et al., "Selective Mn deposition on Cu lines", poster presentation, 12th International Conference on Atomic Layer Deposition, Jun. 19, 2012, Dresden, Germany.

Sapp, et al.; Thermo-Mechanical and Electrical Characterization of Through-Silicon Vias with a Vapor Deposited Polyimide Dielectric Liner; IEEE; 2012.

Schmeißer, Decomposition of formic acid, Chemnitz University of Technology, pp. 1-13, Aug. 31, 2011.

Schmeißer, Reduction of Copper Oxide by Formic Acid an ab-initio study, Chemnitz University of Technology, pp. 1-42, Sep. 2011.

Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.

Senesky et al., "Aluminum nitride as a masking material for the plasma etching of silicon carbide structures," 2010, IEEE, pp. 352-355.

Sundberg, et al.; Organic and Inorganic-Organic Thin Film Structures by Molecular Layer Deposition: A Review; Beilstein J. Nanotechnol; 2014, 5, pp. 1104-1136.

Toirov, et al.; Thermal Cyclodehydration of Polyamic Acid Initiated by UV-Irradiation; Iranian Polymer Journal; vol. 5, No. 1; pp. 16-22; 1996; Iran.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

\* cited by examiner

SELECTIVE FORMATION OF METAL SILICIDES

CROSS-REFERENCE TO RELATED APPLICATION

This application is related to U.S. Provisional Patent Application 62/200,502, filed Aug. 3, 2015 and entitled "SELECTIVE DEPOSITION ON METAL OR METALLIC SURFACES RELATIVE TO DIELECTRIC SURFACES" and U.S. Provisional Patent Application 62/281,593, filed Jan. 21, 2016 and entitled "SELECTIVE DEPOSITION ON METAL OR METALLIC SURFACES RELATIVE TO DIELECTRIC SURFACES," the disclosures of which are hereby incorporated by reference in their entireties.

BACKGROUND OF THE INVENTION

Field of the Invention

The present application relates generally to the field of semiconductor device manufacturing.

Description of the Related Art

The continuous scaling of CMOS devices has increased process cost significantly, primarily due to the need for multiple patterning. To compensate for the rapid process cost increase and maintain a low cost per transistor, accelerated contact area scaling is required. This reduction in contact area raises an enormous challenge with respect to source/drain contact resistance in such devices, because contact resistance is inversely proportional to contact area.

Currently for FinFET devices, the contact structure can include Ti deposited by physical vapor deposition (PVD) followed by TiN deposited by atomic layer deposition (ALD) and W deposited by ALD or chemical vapor deposition (CVD) to fill the contact trench. PVD processes typically have poor step coverage and only deposit on top of the source/drain, which has a very limited contact area.

Metal silicides can be used as electrical contacts in integrated circuits. Typically silicides are formed by depositing a metal by a PVD process on top of silicon and annealing to induce a solid state reaction. Part of the silicon that is present in gate, source and/or drain structures can thus be converted into a low-resistivity metal silicide. However, the non-selective nature of this metal deposition process may require the addition of complicated patterning steps. This process is carried out to realize a conductive path with a low bulk resistivity on the one hand, and to ensure good contact resistance on the other hand. However, this reductive process can consume the source/drain substrate, leading to undesirable or degraded device performance, for example increased resistance due to a reduction in the contact area or device cross-section.

SUMMARY OF THE INVENTION

In some aspects, processes for selectively depositing metal silicides are provided. According to some processes, a metal silicide is selectively deposited on a first H-terminated surface of a substrate relative to a second oxide, nitride, oxynitride, or carbide surface. The selective deposition process may comprise one or more deposition cycles comprising contacting the substrate with a first vapor phase precursor comprising silicon, removing the first vapor phase precursor and reaction byproducts, if any, from the substrate, contacting the substrate with a second vapor phase metal halide precursor comprising Ta, Nb, or Ti, and removing the second vapor phase precursor and reaction byproducts, if any, from the substrate. In some embodiments the metal silicide selectively deposited on the first surface of the substrate relative to the second surface of the same substrate comprises Ta, Nb, or Ti.

In some embodiments H-terminations may be provided on the first surface of the substrate by treating at least the first surface prior to depositing the metal silicide. In some embodiments the H-terminations may be provided on the first surface of the substrate by contacting at least the first surface with HF. In some embodiments the second surface may be oxidized by treating at least the second surface prior to depositing the metal silicide. In some embodiments treating at least the second surface may comprise exposing the substrate to ambient conditions and/or moisture. In some embodiments the process may be an atomic layer deposition (ALD) process.

In some embodiments the first surface may comprise silicon or germanium. In some embodiments the second surface may comprise silicon oxide, silicon nitride, germanium oxide, germanium nitride, titanium oxide, titanium nitride, hafnium oxide, or hafnium nitride. In some embodiments the metal silicide may be selectively deposited on the first surface of the substrate relative to the second surface of the substrate with a selectivity of at least 90%. In some embodiments the first vapor phase precursor comprising silicon may comprise a silane. In some embodiments the first vapor phase precursor comprising silicon may comprise disilane or trisilane. In some embodiments the second vapor phase metal halide precursor may comprise a chloride or fluoride. In some embodiments the second vapor phase metal halide precursor may comprise $TaCl_5$ or $TaF_5$.

In some aspects processes for forming a contact structure on a substrate are provided. According to some embodiments, processes for forming a contact structure on a substrate may comprise providing a substrate comprising a first H-terminated surface and a second oxide, nitride, oxynitride, or carbide surface, and selectively depositing a metal silicide contact layer on the first H-terminated surface of the substrate relative to the second oxide, nitride, oxynitride, or carbide surface by an atomic layer deposition (ALD) process. In some embodiments the ALD process may comprise alternately and sequentially contacting the substrate with a silicon precursor and metal halide precursor. In some embodiments the metal of the metal halide precursor and the metal of the metal silicide contact layer may be one of Ta, Nb, and Ti. In some embodiments the process for forming a contact structure on a substrate may additionally comprise depositing a liner over the metal silicide contact layer; and depositing a low resistivity material over the metal silicide contact layer and the liner to thereby form a contact structure.

In some embodiments selectively depositing a metal silicide contact layer may comprise selectively depositing until a metal silicide film of a desired thickness is formed. In some embodiments the process may further comprise treating at least the first surface of the substrate to provide H-terminations thereon. In some embodiments treating at least the first surface of the substrate may comprise contacting at least the first surface of the substrate with HF. In some embodiments the first surface of the substrate may comprise a source/drain region. In some embodiments the liner may comprise TiN and the low resistivity material may comprise W. In some embodiments the silicon precursor may comprise disilane or trisilane and the metal halide precursor may comprise $TaCl_5$ or $TaF_5$.

BRIEF DESCRIPTION OF THE DRAWINGS

The invention will be better understood from the detailed description and from the appended drawings, which are meant to illustrate and not to limit the invention, and wherein.

DETAILED DESCRIPTION

Figure 1:
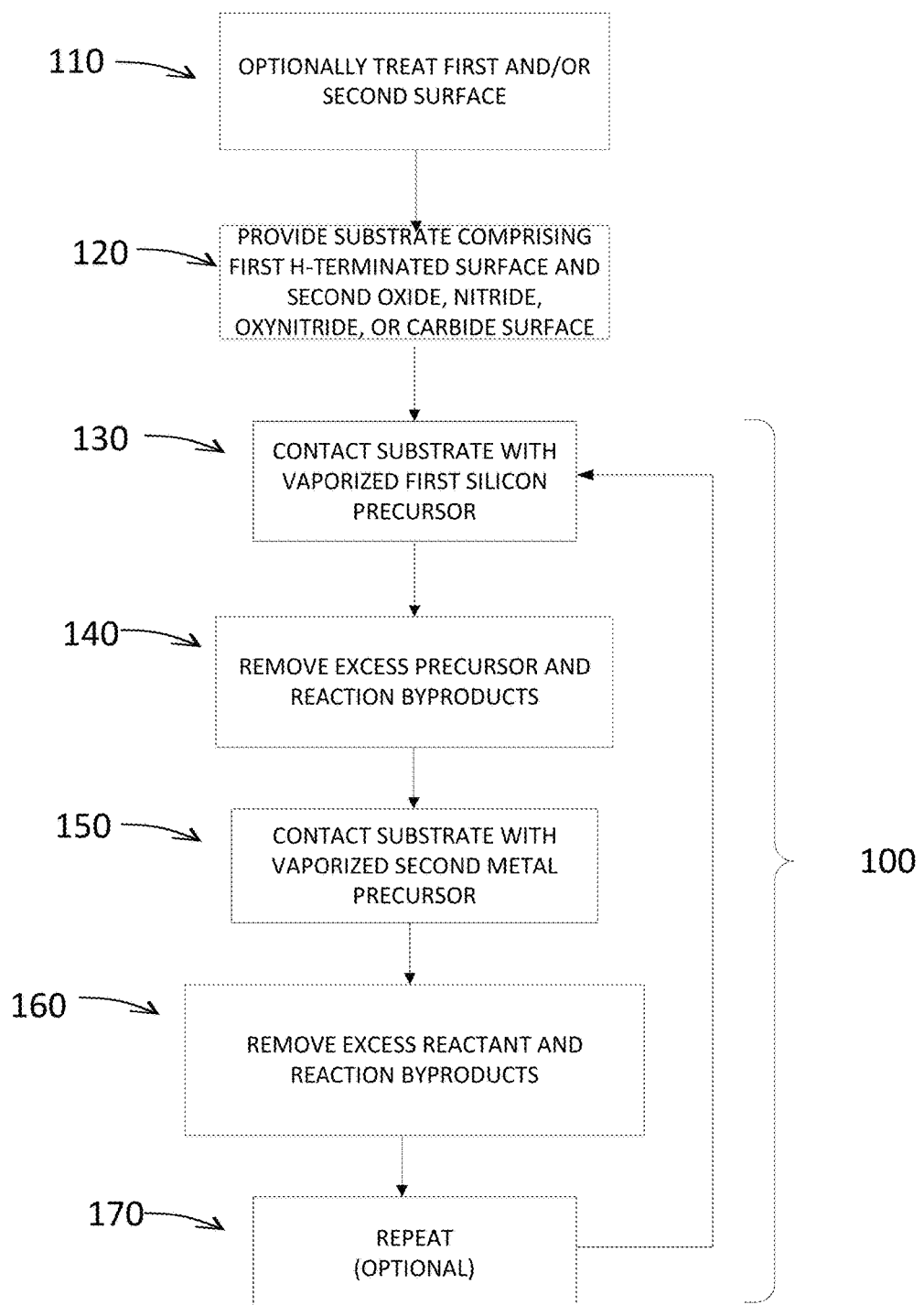
FIG. 1 illustrates a deposition process flow for selectively depositing a metal silicide material on a first H-terminated surface of a substrate relative to a second, different surface of the same substrate.

In some situations it may be desirable to selectively form or deposit a metal silicide material on one surface of a substrate relative to a second, different surface of the same substrate. For example, selective deposition may be used to form a metal silicide contact layer in a FinFET device. In some embodiments a metal silicide material may be deposited or formed selectively on a first hydrogen-terminated surface of a substrate preferentially over a second, different surface, such as an oxide, nitride, oxynitride, or carbide surface of the same substrate.

One or more surfaces may be treated in order to enhance deposition on one surface relative to one or more different surfaces. In some embodiments a first surface is treated, or activated, in order to enhance deposition on the first surface relative to a second surface. In some embodiments a second surface is treated, or deactivated, in order to decrease or inhibit deposition on the second surface relative to a first surface. In some embodiments a first surface may be treated to enhance deposition and a second surface may be treated to inhibit deposition, thereby increasing selective deposition on the first surface relative to the second surface. In some embodiments a deactivating treatment does not involve formation of a self-assembled monolayer (SAM). In some embodiments a deactivating treatment does not comprise treatment with an organic agent.

For example, in some embodiments the first surface of a substrate may be treated to provide a H-terminated surface prior to or at the beginning of the metal silicide deposition process in order to increase or enhance deposition of the metal silicide on the first surface relative to the second, different surface. That is, selective deposition on the treated first, H-terminated surface is increased relative to the second, different surface. In some embodiments, for example, a native oxide present on a first surface may be removed in order to enhance deposition on the first surface relative to the second, different surface. In some embodiments where a native oxide may be present on a first surface the native oxide may be removed prior to or at the beginning of the selective deposition process. In some embodiments removal of a native oxide layer from a first surface may provide a H-terminated surface. In some embodiments, for example, a first surface may be contacted with HF, such as 0.5% HF, prior to or at the beginning of the metal silicide deposition process in order to increase or enhance deposition of the metal silicide on the first surface relative to the second, different surface. In some embodiments treatment of the first surface may comprise an optional in-situ or clustered native oxide removal process performed in the same reactor as the subsequent deposition, or in a separate reaction chamber from which the substrate can be transported to the deposition reactor without intermediate exposure to air, which could result in partial reoxidation or OH termination of the surface. The in-situ native oxide removal process which also provides a H-terminated surface may comprise, for example, exposure to HF vapor or H radicals. In some embodiments treatment of the first surface can include contacting the substrate with one of either the first or second precursors used in a subsequent deposition process prior to or at the beginning of the deposition process.

In some embodiments a metal silicide material or thin film is deposited on a first H-terminated surface of a substrate relative to a second, different surface, and the second, different surface is oxidized prior to or at the beginning of the deposition process in order to decrease or inhibit deposition of the metal silicide on the second surface relative to the first, H-terminated surface. That is, selective deposition on the first, H-terminated surface is increased relative to the treated second, different surface.

In some embodiments the first surface on which selective deposition of a metal silicide occurs comprises an H-terminated surface. In some embodiments the H-terminated first surface may comprise silicon and/or germanium. That is, the first surface may comprise H-terminated silicon and/or germanium. In some embodiments the first surface is formed by etching native oxide of silicon and/or germanium and the first surface comprises Si—H and/or Ge—H bonds. In some embodiments the first surface may be a —SiH, —SiH$_2$, —SiH$_3$, —GeH, —GeH$_2$, or —GeH$_3$ surface. In some embodiments the first surface is a pure silicon and/or germanium surface.

In some embodiments the second, different surface may comprise, for example, different surface terminations from the first surface, and/or a different material composition from the first surface. In some embodiments the second surface comprises an oxide, nitride, oxynitride, or carbide surface. In some embodiments the second surface may comprise, for example, silicon oxides, silicon nitrides, germanium oxides, germanium nitrides, titanium oxides, titanium nitrides, hafnium oxides, and/or hafnium nitrides. In some embodiments a second surface may be a native oxide surface, for example a native silicon oxide surface. In some embodiments the second surface may comprise a thermal oxide, for example a thermal silicon oxide surface. In some embodiments a second surface is oxidized prior to or at the beginning of the deposition process to provide an oxide, nitride, oxynitride, or carbide surface. For example, in some embodiments a TiN surface may be oxidized to provide a titanium oxide surface prior to or at the beginning of the deposition process.

In some embodiments a metal silicide selectively formed or deposited on a first surface relative to a second, different surface may comprise, for example, tantalum silicide (TaSi$_x$), titanium silicide (TiSi$_x$), and/or niobium silicide (Nb- Si$_x$). In some embodiments the deposited metal silicide film or material may comprise a low resistivity film or material.

In some embodiments the deposited metal silicide material may have low resistivity. In some embodiments the deposited metal silicide material may have a resistivity of between about 150 μΩcm to about 300 μΩcm, preferably from about 150 μΩcm to about 250 μΩcm.

In some embodiments the selective deposition processes disclosed herein do not utilize plasma, such as direct plasma. In some instances, however, a selective formation process could utilize radicals made by plasma as a reactant. The radicals are preferably not too energetic and thus do not significantly destroy or degrade a surface of the substrate. Typically direct plasma can harm the second surface of the substrate too significantly to be useful, and thus is not used in some embodiments.

In some embodiments deposition on the first surface of the substrate occurs selectively relative to deposition on the second surface of the substrate. In some embodiments selectivity may be measured in terms of, for example, the thickness or mass of material deposited on the first surface of a substrate relative to the second surface. In some embodiments selectivity may be measured in terms of, for example, the area of the first and second surfaces covered by deposited material. Unless indicated otherwise, selectivity is measured in terms of thickness of material deposited on the first surface of the substrate relative to the second surface.

In some embodiments deposition on the first surface of the substrate relative to the second surface of the substrate is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 80% selective, or about 70% selective, which may be selective enough for some particular applications. In some embodiments the deposition on the first surface of the substrate relative to the second surface of the substrate is at least about 50% selective, which may be selective enough for some particular applications.

In some embodiments an etch step may be used subsequent to or in the course of deposition to remove material that is non-selectively deposited. Although addition of an etch step would typically add cost and complexity to the process, in some situations it may be commercially desirable, for example if it is less expensive overall than other options. In some embodiments the etch process may be a wet etch process or a dry etch process.

In some embodiments deposition on the first surface of the substrate relative to the second surface of the substrate can be performed up to about 100 deposition cycles before losing the desired selectivity, or up to about 50 deposition cycles, or up to about 20 deposition cycles, or up to about 10 deposition cycles, or up to about 5 deposition cycles before losing selectivity. In some embodiments even deposition of 1 or 2 cycles before losing selectivity can be useful.

A loss of selectivity can be understood to have occurred when the selectivities mentioned above are no longer met. Depending on the specific circumstances, a loss of selectivity may be considered to have occurred when deposition on the first surface of the substrate relative to the second surface of the substrate is less than about 50% selective, 70% selective, 80% selective, or 90% selective, less than about 95% selective, less than about 96%, 97%, 98% or 99% selective or greater.

Although certain embodiments may have a lower selectivity than certain other embodiments, other processes, for example, an etch, may optionally be used to remove undesirably deposited material from at least the second surface in those relatively lower selectivity embodiments.

In some embodiments deposition on the first surface of the substrate relative to the second surface of the substrate can be performed up to a thickness of about 50 nm before losing the desired selectivity, or up to about 15 nm, or up to 10 nm, or up to about 5 nm, or up to about 3 nm, or up to about 2 nm, or up to about 1 nm before losing the desired selectivity. In some embodiments even deposition of up to 3 Å or 5 Å before losing the desired selectivity can be useful. Depending on the specific circumstances, a loss of selectivity may be considered to have occurred when deposition on the first surface of the substrate relative to the second surface of the substrate is less than about 90% selective, less than about 95% selective, less than about 96%, 97%, 98% or 99% selective or greater.

In some embodiments a metal silicide film or material is deposited according to a process described herein and the deposition process is not a selective deposition process. For example, in some embodiments a metal silicide film may be deposited on a first surface H-terminated of a substrate and a second oxide, nitride, oxynitride, or carbide surface of the same substrate. That is, in some embodiments deposition on a first surface is about 0% selective relative to a second, different surface.

In some embodiments the selective deposition process is an atomic layer deposition (ALD) type process. In some embodiments the deposition process is a pure ALD process. In some embodiments the deposition process is a vapor deposition process comprising one or more deposition cycles in which a substrate is alternately and sequentially contacted with a first vapor phase reactant and a second vapor phase reactant.

ALD Type Processes

ALD type processes are based on controlled, self-limiting surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses.

Briefly, a substrate comprising at least a first surface and a second, different surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface terminations and reactant species involved. Here, the temperature may vary depending on the type of film being deposited and is preferably at or below about 500° C., more preferably at or below about 450° C. and most preferably from about 250° C. to about 400° C.

The surface of the substrate is contacted with a vapor phase first reactant or precursor. In some embodiments a pulse of vapor phase first reactant is provided to a reaction space containing the substrate. In some embodiments the substrate is moved to a reaction space containing vapor phase first reactant. Conditions are preferably selected such that no more than about one monolayer of the first reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

The surface of the substrate is contacted with a vapor phase second gaseous reactant or precursor. In some embodiments a pulse of a second gaseous reactant is provided to a reaction space containing the substrate. In some embodiments the substrate is moved to a reaction space containing the vapor phase second reactant. Excess second reactant and gaseous byproducts of the surface reaction, if any, are removed from the substrate surface. The steps of contacting and removing are repeated until a thin film of the desired thickness has been selectively formed on the first surface of substrate, with each cycle leaving no more than a molecular monolayer. Additional phases comprising alternately and sequentially contacting the surface of a substrate with other reactants can be included to form more complicated materials, such as ternary materials.

As mentioned above, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds, preferably between about 0.5 and 5 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in a reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

In some embodiments the growth rate of the metal silicide film on the first surface of the substrate may be greater than or equal to about 0.5 Å/cycle, greater than or equal to about 2 Å/cycle, greater than or equal to about 5 Å/cycle, and, in some embodiments, even greater than about 10 Å/cycle.

In some embodiments the deposited metal silicide films are highly conformal. In some embodiments, the metal silicide film formed has step coverage of more than about 50%, more than about 80%, more than about 90%, or even more than about 95% on structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

In some embodiments the metal silicide film or material formed may be a relatively pure metal silicide film. In some embodiments, the metal silicide film comprises less than about 5-at % of any impurity other than hydrogen, preferably less than about 3-at % of any impurity other than hydrogen, and more preferably less than about 1-at % of any impurity other than hydrogen. In some embodiments a metal silicide film comprises less than about 5 at-% fluorine, less than about 3 at-% fluorine less than about 2 at-% fluorine or even less than about 1 at-% fluorine. In some embodiments, a metal silicide film comprises less than about 2-at % oxygen, preferably less than about 1-at % or less than about 0.5-at % and even less than about 0.25-at %. In some embodiments, a metal silicide film comprises less than about 2-at % hydrogen, preferably less than about 1-at % or less than about 0.5-at % and even less than about 0.25-at %. In some embodiments, a metal silicide film comprises less than about 1-at % carbon, preferably less than about 0.5-at % or less than about 0.25-at % and even less than about 0.1-at %.

Examples of suitable reactors that may be used include commercially available ALD equipment such as the F-120® reactor, Eagle® XP8, Pulsar® reactor and Advance® 400 Series reactor, available from ASM America, Inc. of Phoenix, Ariz., ASM Japan KK, Tokyo, Japan and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run. For example, a substrate may be subjected to a native oxide removal process in a first module of a cluster tool and may be subjected to a deposition process in a different module of the same tool.

A stand-alone reactor can be equipped with a load-lock. In that case, it is not necessary to cool down the reaction space between each run.

Referring to FIG. 1 and according to some embodiments a substrate comprising a first H-terminated surface as described above, such as H-terminated silicon, and a second oxide, nitride, oxynitride, or carbide surface is provided at step 120. A metal silicide is selectively deposited on the first surface of the substrate by an ALD type deposition process 100 comprising at least one deposition cycle comprising:

contacting the substrate with a vaporized first silicon precursor at step 130. The first silicon precursor may comprise a silane, for example disilane or trisilane;

removing excess first precursor and reaction byproducts, if any, from the substrate at step 140;

contacting the substrate with a vaporized second metal precursor at step 150. The second metal precursor may comprise a metal halide, for example a Ta, Nb, or Ti halide;

removing excess second precursor and reaction byproducts, if any, from the substrate at step 160;

optionally repeating the contacting and removing steps at step 170 until a thin film comprising the selectively deposited metal silicide of the desired thickness has been formed.

As mentioned above, in some embodiments one or more surfaces of the substrate may be treated in order to enhance deposition on the first surface relative to one or more different surfaces prior to or at the beginning of deposition process 100. In FIG. 1 this is indicated by step 110 in which the first and/or second surface may optionally be treated. In some embodiments the first surface may be treated to provide H-terminations. For example, the first surface may be contacted with HF to provide a surface comprising H-terminations, for example a —$SiH_3$ terminations. In some embodiments the second surface may be treated to oxidize the second surface. For example, the second surface may be exposed to ambient conditions to thereby provide an oxidized surface, for example an oxidized TiN surface.

Although the illustrated deposition cycle begins with contacting the surface of the substrate with the first silicon precursor, in other embodiments the deposition cycle begins with contacting the surface of the substrate with the second metal precursor. It will be understood by the skilled artisan that in general contacting the substrate surface with the first precursor and second precursor are interchangeable in the ALD cycle.

In some embodiments, the reactants and reaction byproducts can be removed from the substrate surface by stopping the flow of first precursor while continuing the flow of an inert carrier gas such as nitrogen or argon.

In some embodiments, the precursor and reaction byproducts can be removed from the substrate by stopping the flow of precursor while continuing the flow of an inert carrier gas. In some embodiments the substrate is moved such that different precursors alternately and sequentially contact the substrate in a desired sequence for a desired time. In some embodiments the removing steps, 140 and 160 are not performed. In some embodiments no precursor may be removed from the various parts of a chamber. In some embodiments the substrate is moved from a part of the chamber containing a first precursor to another part of the chamber containing the second precursor. In some embodiments the substrate is moved from a first reaction chamber to a second, different reaction chamber.

In some embodiments each reaction is self-limiting and monolayer by monolayer growth is achieved. These may be referred to as "true ALD" reactions. In some such embodiments the first precursor (or other precursor as described herein) may adsorb on the first surface of the substrate in a self-limiting manner. A second precursor in turn will react with the adsorbed first precursor to form up to a monolayer of metal silicide on the first surface of the substrate.

However, in some embodiments ALD-type reactions are provided, in which there may be some precursor decomposition, but the growth saturates. That is, in some embodiments although a certain amount of film growth may be caused by thermal decomposition of the first precursor (or second precursor as described herein) at some deposition temperatures, saturated growth is preferably achieved when the second precursor is utilized. Such a reaction is an example of an ALD-type reaction. In such ALD-type reactions, films with good uniformity and relatively few impurities can be deposited.

In some embodiments the metal silicide is deposited to be a distinct layer from the substrate, meaning that no material from the substrate is consumed to form the metal silicide, except that some bonds may form between the substrate and the metal silicide. In some embodiments the selectively deposited material is not annealed in order to form a metal silicide material.

In some embodiments a distinct metal silicide layer is formed on the substrate surface and the metal silicide layer may subsequently be annealed or subjected to an annealing process. An annealing process may result in some consumption of the substrate and/or the formation of bonds between the metal silicide layer and the substrate. In some embodiments bonds may be formed between the substrate and the metal silicide during the annealing process. In some embodiments an annealing process performed subsequent to the formation of a distinct metal silicide layer on the substrate surface may reduce the contact resistance between the metal silicide and the substrate. In some embodiments where some of the substrate may be consumed during an annealing process, the amount of substrate consumed may be limited such that it does not result in undesirable or degraded device performance, for example by reducing the contact area or device cross-section. In some embodiments where consumption of the substrate may occur during an annealing process the consumption can be limited by regulating the time and temperature of the annealing process as would be clear to one of skill in the art. In some embodiments the amount of substrate consumer by an annealing process may be limited by the amount of excess metal present in the deposited metal silicide film. In some embodiments the amount of excess metal in the metal silicide film may be controlled by adjusting the composition of the metal silicide film, as would be clear to one of skill in the art, for example by adjusting the flow rate of one or more of the vapor phase precursors in the metal silicide deposition process to provide a metal silicide film with the desired amount of excess metal. In some embodiments the amount of excess metal may be controlled by regulating the total thickness of the deposited metal silicide film, as would be clear to one of skill in the art.

Figure 2:
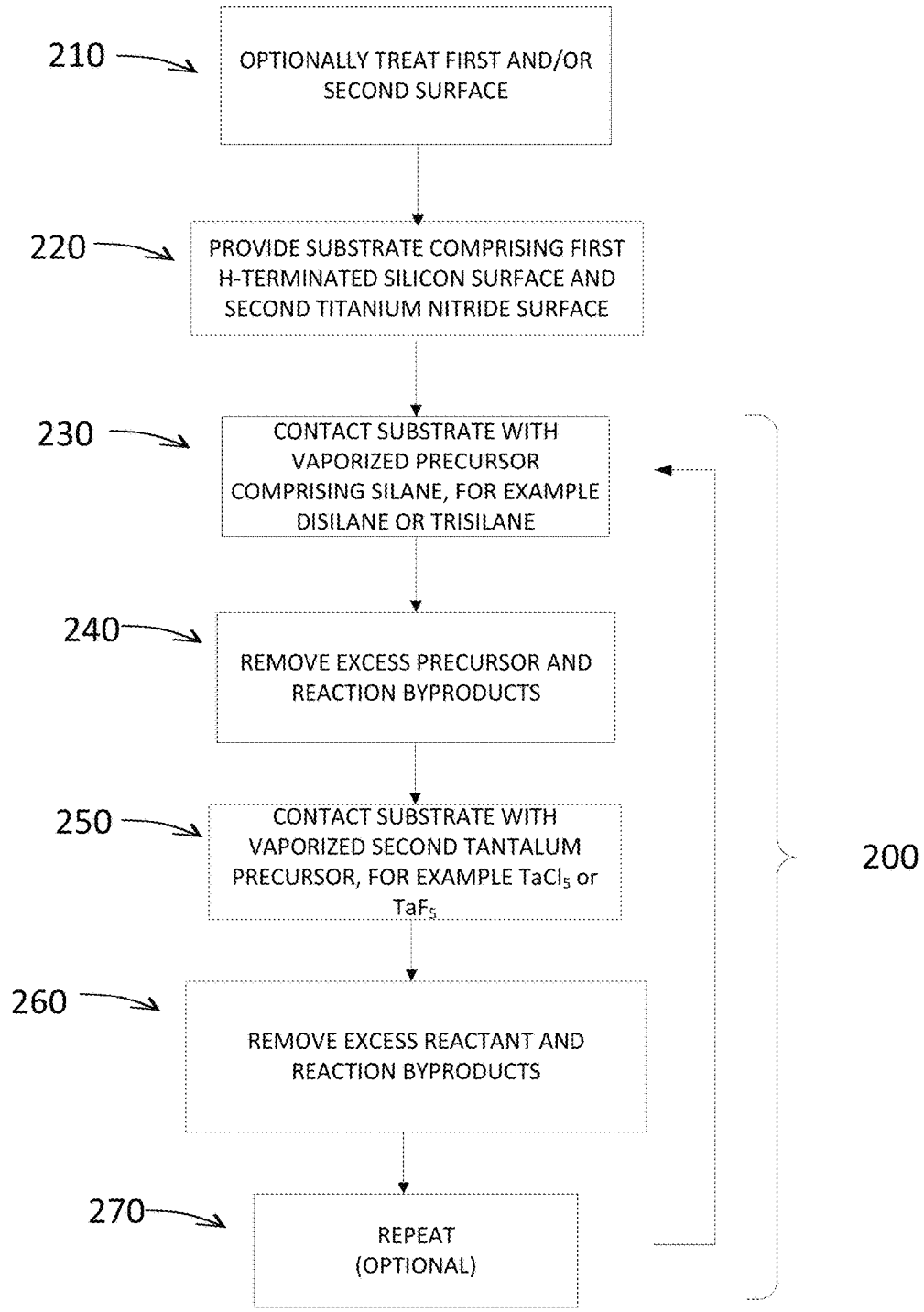
FIG. 2 illustrates a deposition process flow for selectively depositing a material comprising tantalum silicide on a first H-terminated surface of a substrate relative to a second, different surface of the same substrate.

Referring to FIG. 2 and according to some embodiments a substrate comprising a first H-terminated surface as described above, such as H-terminated silicon, and a second oxide, nitride, oxynitride, or carbide surface, such as TiN, is provided at step 220. A material comprising tantalum silicide is selectively deposited on the first surface of the substrate by an ALD type deposition process 200 comprising at least one deposition cycle comprising:

contacting the substrate with a vaporized first silicon precursor at step 230. The first silicon precursor may comprise a silane, for example disilane or trisilane;

removing excess first precursor and reaction byproducts, if any, from the substrate at step 240;

contacting the substrate with a vaporized second tantalum precursor at step 250. The second tantalum precursor may comprise a tantalum halide, for example $TaCl_5$ or $TaF_5$;

removing excess second precursor and reaction byproducts, if any, from the substrate at step 260;

optionally repeating the contacting and removing steps at step 270 until a thin film comprising the selectively deposited metal silicide of the desired thickness has been formed.

As mentioned above, in some embodiments one or more surfaces of the substrate may be treated in order to enhance deposition on the first surface relative to one or more different surfaces prior to or at the beginning of deposition process 200. In FIG. 2 this is indicated by step 210 in which the first and/or second surface may optionally be treated. In some embodiments the first surface may be treated to provide H-terminations. For example, the first surface may be contacted with HF to provide a surface comprising H-terminations, for example a —$SiH_3$ terminations. In some embodiments the second surface may be treated to oxidize the second surface. For example, the second surface may be exposed to ambient conditions to thereby provide an oxidized surface, for example an oxidized TiN surface.

According to some embodiments a substrate comprising a first H-terminated surface as described above, such as H-terminated silicon, and a second oxide, nitride, oxynitride, or carbide surface is provided. The substrate may then be pretreated with a vapor phase halide or silane precursor. In some embodiments the pretreatment may activate the first surface H-terminated surface in order to enhance deposition on the first surface relative to the second surface. A metal silicide is selectively deposited on the first surface of the substrate by an ALD type deposition process comprising at least one deposition cycle comprising:

contacting the substrate with a vaporized first silicon precursor, wherein the first silicon precursor may comprise a silane, for example disilane or trisilane;

removing excess first precursor and reaction byproducts, if any, from the substrate;

contacting the substrate with a vaporized second metal precursor, wherein the second metal precursor may comprise a metal halide, for example a Ta, Nb, or Ti halide;

removing excess second precursor and reaction byproducts, if any, from the substrate;

optionally repeating the contacting and removing steps until a thin film comprising the selectively deposited metal silicide of the desired thickness has been formed.

In some embodiments pretreating the substrate with a vapor phase halide or silane precursor may comprise contacting the substrate surface with vapor phase halide or silane precursor. In some embodiments the silane precursor may comprise disilane or trisilane. In some embodiments the halide precursor may comprise a metal halide precursor, for example the metal halide precursor used in the metal silicide deposition process. In some embodiments the halide precursor may comprise one of $TaF_5$, $TaCl_5$, $NbF_5$, $NbCl_5$, $TiF_3$, $TiBr_3$, and $TiCl_3$. In some embodiments the pretreatment may activate the first surface in order to enhance deposition on the first surface relative to the second surface. In some embodiments pretreating the substrate may provide reactive sites on the first surface to react with the first vaporized precursor of the ALD process. In some embodiments the precursor used in the pretreatment step may be the same as a precursor used in the ALD process. In some embodiments the precursor used in the pretreatment step may not be the same as the first vapor phase precursor of the ALD process.

Silicon Precursors

In some embodiments a silicon precursor is provided to the substrate such that a layer is formed on a first surface of the substrate relative to a second, different surface of the substrate. In some embodiments the silicon precursor is selected from the silane family $Si_nH_{2n+2}$ (where n is equal to or greater than 1). In some embodiments the silicon precursor may comprise monosilane ($SiH_4$), disilane ($Si_2H_6$), trisilane ($Si_3H_8$), or tetrasilane ($Si_4H_{10}$), preferably disilane or trisilane. In some embodiments the silicon precursor can be selected from silane compounds having the formula: $SiH_xL_y$, where L is a ligand selected from the groups including: alkyl, alkenyl, alkynyl, alkoxide, and amine. In some cases L is a ligand selected from the halide group: F, Cl, Br and I. In some embodiments the silicon precursor may comprise dichlorosilane ($SiH_2Cl_2$, or 'DCS').

Metal Precursors

In some embodiments the metal precursor comprises a metal halide. In some embodiments the metal precursor preferably comprises fluorine. In some embodiments the metal of the metal precursor comprises Ta, Nb, or Ti. In some embodiments the metal precursor is selected from $TaF_5$ and $TaCl_5$. In some embodiments the metal precursor is selected from $NbF_5$ and $NbCl_5$. In some embodiments the metal precursor is selected from $TiF_3$, $TiBr_3$, and $TiCl_3$.

EXAMPLE

In this example tantalum silicide ($TaSi_x$) was selectively deposited on a first substrate comprising an H-terminated silicon surface relative to a substrate comprising a native silicon oxide surface, a substrate comprising a 1000 Å thick thermal oxide surface, and a substrate comprising a 15 Å TiN surface on thermal oxide on silicon. The substrate comprising a 15 Å TiN surface on thermal oxide on silicon was exposed to ambient conditions prior to the deposition process. The first substrate comprised an H-terminated silicon wafer, that is, the surface of the first substrate comprised Si—H terminations.

$TaSi_x$ was deposited on the first substrate by an ALD process as described herein in an EmerALD™ ALD tool. The deposition process included 30 deposition cycles carried out at a deposition temperature of about 300° C. The sample $TaSi_x$ material was deposited using disilane as a silicon precursor and $TaF_5$ as a metal precursor. Each deposition cycle included a contacting time of about 0.6 seconds for the silicon precursor and a contacting time of about 2 seconds for the metal precursor. A second sample was also prepared using the above described deposition process and including 150 deposition cycles.

Figure 3A:
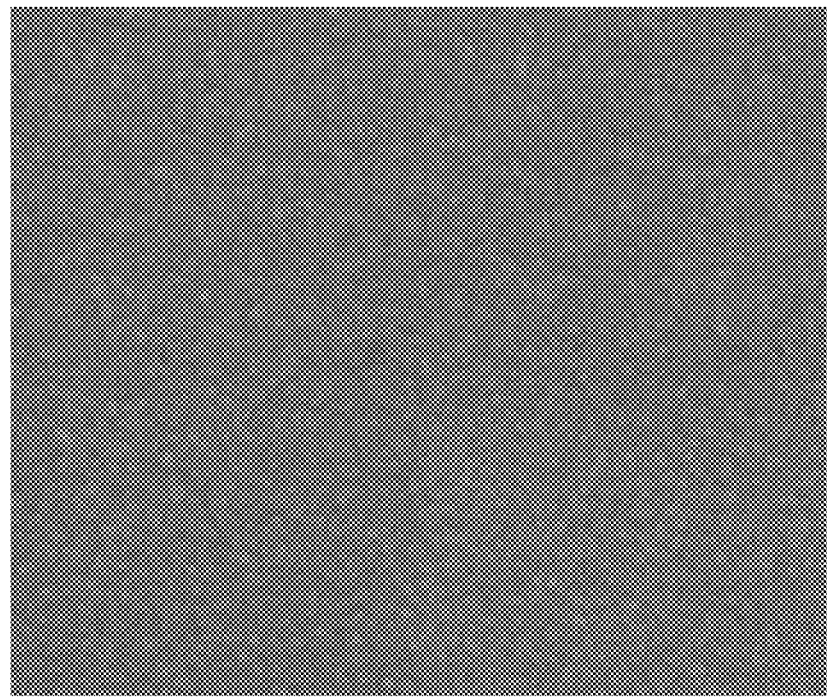
FIG. 3A is an SEM image of a TaSi$_x$ film deposited on substrate comprising an H-terminated surface by an ALD process as described herein.

A four point probe sheet resistance measurement was taken for both $TaSi_x$ samples deposited on H-terminated silicon. The sheet resistance measurements showed low conductivity, about 30 ohm/sq for the $TaSi_x$ sample deposited using 150 deposition cycles, and about 300 ohm/sq for the sample deposited using 30 deposition cycles, which was indicative of relatively uniform $TaSi_x$ film deposition. X-ray spectroscopy was used to confirm deposition of a TaSix film on the H-terminated silicon substrates. The $TaSi_x$ film was found to be about 16.9 nm thick for the sample formed by an ALD process comprising 30 deposition cycles. A scanning electron microscope (SEM) was also confirmed the presence of the $TaSi_x$ film. FIG. 3A shows an SEM image of the $TaSi_x$ film formed by an ALD process comprising 30 deposition cycles.

Figure 3B:
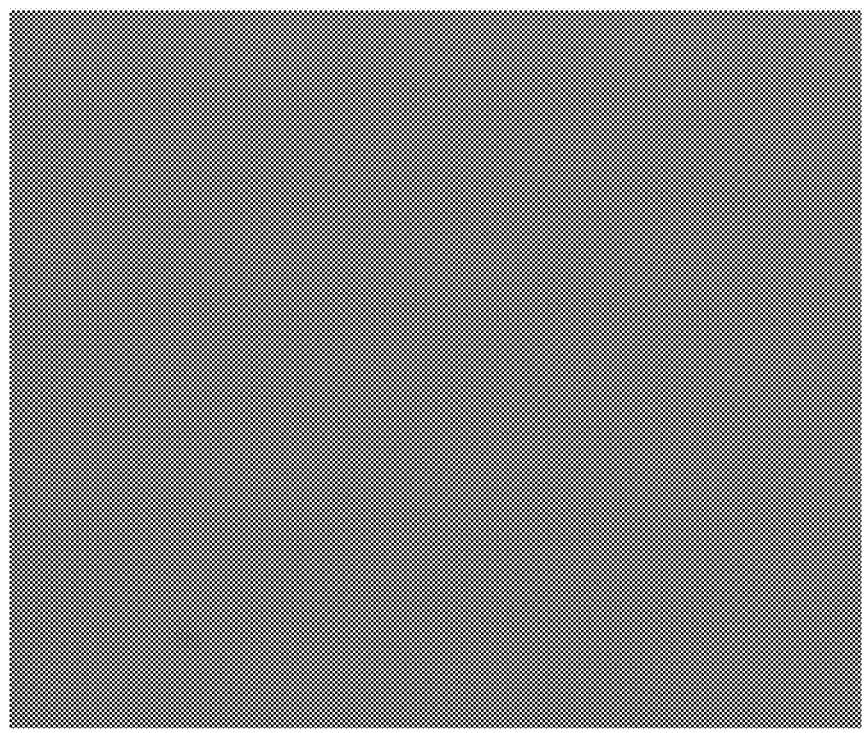
FIG. 3B is an SEM image of a substrate comprising a 15 Å TiN surface on thermal oxide on silicon subsequent to an ALD process as described herein.
Figure 3C:
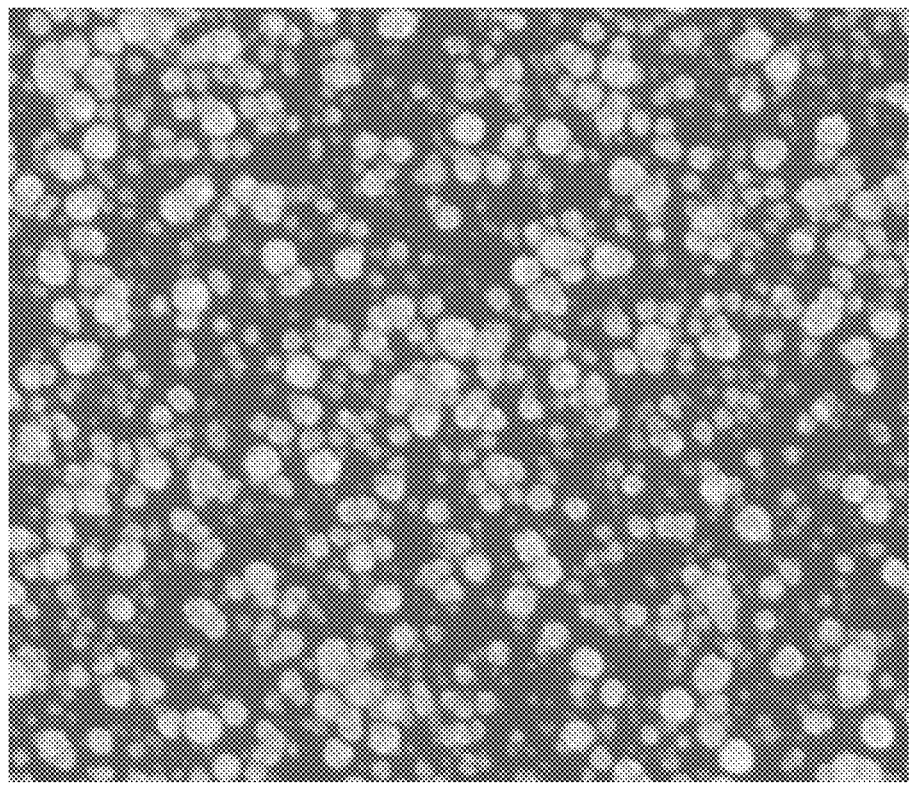
FIG. 3C is an SEM image of a substrate comprising a native silicon oxide surface subsequent to an ALD process as described herein.
Figure 3D:
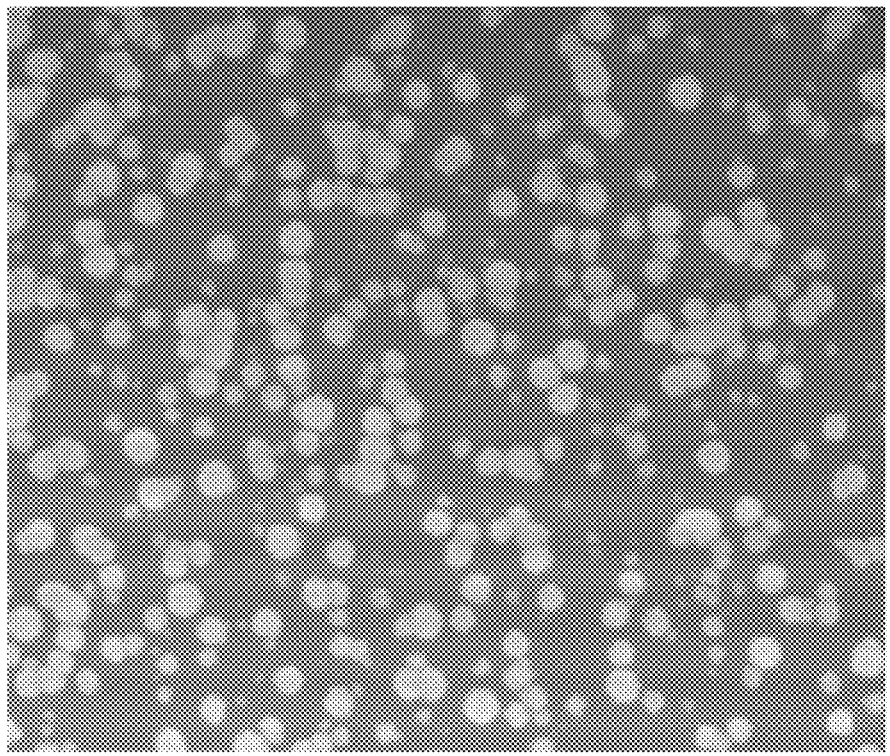
FIG. 3D is an SEM image of a substrate comprising a thermal silicon oxide surface subsequent to an ALD process as described herein.

The substrate comprising a native silicon oxide surface, the substrate comprising a thermal oxide surface, and the substrate comprising a 15 Å TiN surface on thermal oxide on silicon were likewise each subjected to an identical ALD process as used to deposit $TaSi_x$ on H-terminated silicon and described above, the ALD process comprising 30 deposition cycles. A four point probe sheet resistance measurement was taken for each substrate subsequent to the deposition processes and no conductivity was measured. This result indicates that no $TaSi_x$ film was deposited on the substrates. X-ray spectroscopy further confirmed that no film had been deposited. FIG. 3B shows an SEM image of the substrate comprising a 15 Å TiN surface on thermal oxide on silicon subsequent to the ALD process. No $TaSi_x$ film can be seen. FIG. 3C shows an SEM image of the substrate comprising a native silicon oxide surface subsequent to the ALD process. $TaSi_x$ island growth can be observed on the substrate, but no film is observed. FIG. 3D shows an SEM image of the substrate comprising a thermal oxide surface subsequent to the ALD process. $TaSi_x$ island growth can be observed on the substrate, but no film is observed.

Integration

The metal silicide films of the present disclosure may be used in a variety of semiconductor applications. In some embodiments a metal silicide material of the present disclosure may be advantageously used as, for example, a gate metal or an ohmic contact layer, such as an ohmic contact to source/drain electrodes. For example, metal silicide films may be particularly useful as a contact layer in a FinFET device. A metal silicide contact layer selectively deposited according to the processes described herein may allow for an increased contact area as compared to a contact layer formed by a different process, such as a reductive contact layer formation process.

Figure 4:
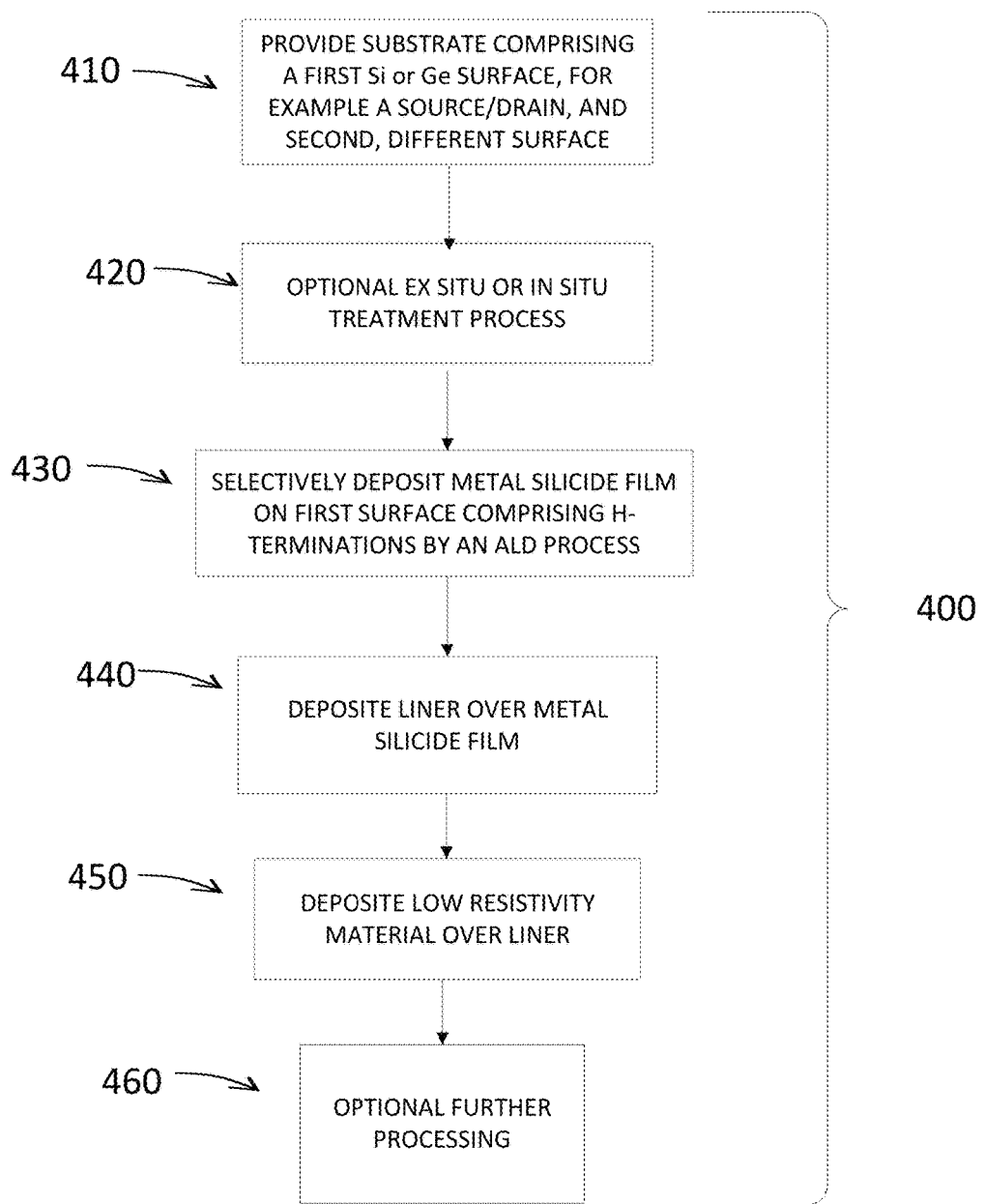
FIG. 4 illustrates an exemplary process flow for forming a metal silicide contact layer.

Referring to FIG. 4, an exemplary process flow 400 for the formation of a metal silicide contact layer in, for example, a FinFET device. In some embodiments the formation of a contact comprising a metal silicide contact layer proceeds as follows:

a suitable substrate comprising a first surface, such as a silicon or germanium source/drain, and at least a second, different surface is provided at step 410;

the substrate is optionally subjected to a treatment process or processes, either ex situ or in situ at step 420;

a metal silicide film is selectively deposited on the first surface of the substrate provided at step 410, said first surface comprising H-terminations, by an ALD process as described herein at step 430;

a liner, for example a TiN liner is deposited over the metal silicide contact layer at step 440, for example by a physical vapor deposition (PVD) process;

a low resistivity material, for example W metal, is deposited over the liner at step 450 to thereby form a contact structure; and any further layers or processing as desired are formed on top of the contact structure in subsequent processing steps at step 460.

According to some embodiments a suitable substrate may comprise a semiconductor substrate comprising a first surface and a second, different surface. In some embodiments a first surface of the substrate provided at step 410 can comprise a source/drain region. In some embodiments the source/drain surface may be located in, for example, a contact trench on a substrate. The surface of the source/drain region may comprise silicon and/or germanium.

In some embodiments the substrate can further include at least a second, different surface, for example a contact trench sidewall. In some embodiments a second, different surface may comprise an oxide, nitride, oxynitride, or carbide surface. In some embodiments the second surface may comprise, for example, silicon oxides, silicon nitrides, germanium oxides, germanium nitrides, titanium oxides, titanium nitrides, hafnium oxides, and/or hafnium nitrides. In some embodiments a second surface may be a native oxide surface, for example a native silicon oxide surface. In some embodiments the second surface may comprise a thermal oxide, for example a thermal silicon oxide surface.

FIG. 4 illustrates an optional treatment process or processes at step 420. A treatment process may be used for any number of reasons, including cleaning the substrate surface, removing native oxide, and/or providing desirable surface terminations on a surface or surfaces of the substrate. In some embodiments an optional treatment process 420 may comprise treating, or activating, the first surface in order to enhance deposition on the first surface relative to the second surface. In some embodiments an optional treatment process 420 may comprise treating, or deactivating, the second surface in order to decrease or inhibit deposition on the second surface relative to the first surface. In some embodiments an optional treatment process 420 may comprise treating the first surface to enhance deposition and treating the second surface to inhibit deposition, thereby increasing selective deposition on the first surface relative to the second surface. In some embodiments an optional treatment process 420 does not involve formation of a self-assembled monolayer (SAM). In some embodiments an optional treatment process 420 does not comprise treatment with an organic agent.

For example, in some embodiments an optional treatment process 420 may comprise treating the first surface of the substrate to provide a H-terminated surface. In some embodiments, for example, an optional treatment process 420 can remove a native oxide layer present on the first surface. In some embodiments where a native oxide may be present on the first surface the optional treatment process 420 may comprise removing the native oxide by a clustered native oxide removal process. In some embodiments an optional treatment process 420 may remove a native oxide layer from the first surface and may also provide a H-terminated surface. In some embodiments, for example, an optional treatment process 420 may comprise contacting the first surface with HF, such as 0.5% HF in order to provide an H-terminated surface. In some embodiments an optional treatment process 420 may comprise contacting the substrate with one of either the first or second precursors of the metal silicide deposition process. In some embodiments an optional treatment process 420 may comprise oxidizing the second surface, for example by exposing the second surface to ambient conditions and/or moisture.

Subsequent to any optional treatment process or processes 420, a metal silicide contact layer is selectively formed on the first surface of the substrate relative to a second surface at step 430 by an ALD type process as described herein. In some embodiments a suitable metal silicide contact layer is one that comprises a metal silicide. Suitable metal silicides include those where the metal is selected from Ta, Nb, and Ti. Suitable metal silicides include, for example, those with a formula $TaSi_x$, $NbSi_x$, and $TiSi_x$. In some embodiments the metal silicide contact layer is deposited to be a distinct layer from the substrate, meaning that no material from the substrate is consumed for the metal silicide contact layer, except that some bonds may form between the substrate and the metal silicide contact layer.

In some embodiments step 430 may include subjecting the deposited metal silicide contact layer to an annealing process. An annealing process may result in some consumption of the substrate and/or the formation of bonds between the metal silicide contact layer and the substrate. In some embodiments bonds may be formed between the substrate and the metal silicide contact layer during the annealing process. In some embodiments an annealing process performed subsequent to the formation of a distinct metal silicide layer on the substrate surface may reduce the contact resistance between the metal silicide contact layer and the substrate. In some embodiments where some of the substrate may be consumed during an annealing process, the amount of substrate consumed may be limited such that it does not result in undesirable or degraded device performance, for example by reducing the contact area or device cross-section.

In some embodiments, the metal silicide film is deposited to achieve a particular thickness. Suitable thicknesses may be greater than or equal to about 0.5 nm and less than or equal to about 10 nm. In some embodiments, the thickness will be between about 1 nm and about 5 nm. In to some embodiments, the suitable thickness will be one that achieves a complete layer over the substrate surface (i.e., one that leaves no gaps). Accordingly, the actual thickness that achieves a complete layer may depend on the type of metal silicide formed and the types of precursors used to achieve the metal silicide.

The first surface comprises an H-terminated surface. In some embodiments the first surface may comprise a three-dimensional structure. In some embodiments the H-terminated first surface may comprise silicon and/or germanium. That is, the first surface may comprise H-terminated silicon and/or germanium. In some embodiments the first surface may be formed by etching native oxide of silicon and/or germanium, for example by an optional treatment process at step 420, and the first surface comprises Si—H and/or Ge—H bonds. In some embodiments the first surface may be a —SiH, —SiH₂, —SiH₃, —GeH, —GeH₂, or —GeH₃ surface. In some embodiments the first surface is a pure silicon and/or germanium surface. In some embodiments the first surface may comprise a source/drain structure.

In some embodiments the deposited metal silicide films are highly conformal. In some embodiments, the metal silicide film formed has step coverage of more than about 50%, more than about 80%, more than about 90%, or even more than about 95% on structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

In some embodiments, subsequent to forming a metal silicide contact layer a liner, for example a TiN liner, is formed over the metal silicide contact layer at step 440. In some embodiments the liner may be formed by a PVD process. In some embodiments the liner may be formed by other processes, such as ALD, CVD, or PEALD. A liner may be desirable in some embodiments, for example to prevent diffusion of metallic elements of a subsequently formed overlying layer into underlying layers and/or to decrease contact resistance to the metal silicide layer. In some embodiments a subsequently deposited or formed low resistivity material may serve as a liner. In some embodiments the liner may protect the metal silicide contact layer during transport or subsequent processing.

In some embodiments a low resistivity material, for example a metal, such as W metal, may be deposited over the liner and metal silicide layer at step 450 to thereby form a contact structure. The low resistivity material may be deposited or formed according to any method known in the art or developed in the future. For example, W metal may be deposited over the metal silicide contact layer and liner by a PVD process. Other exemplary low resistivity materials may include, for example, metal silicides.

In some embodiments, subsequent processing may occur at step 460 after the formation of the contact structure. For example, additional layers may be formed or patterning of the deposited layers may occur. In some embodiments, the process is used in the formation of semiconductor device, such as a FinFET device.

In some embodiments, a process such as the one outlined above, is performed in situ or in a cluster tool. In some embodiments, only the metal silicide formation is performed in situ. In some cases, the substrate may be transferred between tools.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A process for selectively depositing a metal silicide on a substrate having an exposed first surface and an exposed second surface, wherein the first surface is defined by a first material with H-termination, and wherein the second surface comprises a second material with a different composition from the first material, the second material comprising an oxide, nitride, oxynitride, or carbide the process comprising one or more deposition cycles comprising:
   contacting the first surface and the second surface of the substrate with a first vapor phase precursor comprising silicon;
   removing the first vapor phase precursor and reaction byproducts, if any, from the first surface of the substrate and the second surface of the substrate;
   contacting the first surface and the second surface of the substrate with a second vapor phase metal halide precursor comprising Ta, Nb, or Ti; and
   removing the second vapor phase precursor and reaction byproducts, if any, from the first surface and the second surface of the substrate;
thereby selectively depositing a metal silicide comprising Ta, Nb, or Ti on the first surface of the substrate relative to the second surface of the same substrate, wherein the metal silicide deposited on the first surface of the substrate is thicker than any of the metal silicide deposited on the second surface of the same substrate.

2. The process of claim 1, wherein H-terminations are provided on the first surface of the substrate by treating at least the first surface prior to selectively depositing the metal silicide.

3. The process of claim 2, wherein H-terminations are provided on the first surface of the substrate by contacting at least the first surface with HF.

4. The process of claim 1, wherein the second surface is oxidized by treating at least the second surface prior to selectively depositing the metal silicide.

5. The process of claim 4, wherein treating at least the second surface comprises exposing the substrate to ambient conditions and/or moisture.

6. The process of claim 1, wherein the process is an atomic layer deposition (ALD) process.

7. The process of claim 1, wherein the first surface comprises silicon or germanium.

8. The process of claim 1, wherein the second surface comprises silicon oxide, silicon nitride, germanium oxide, germanium nitride, titanium oxide, titanium nitride, hafnium oxide, or hafnium nitride.

9. The process of claim 1, wherein the metal silicide is selectively deposited on the first surface of the substrate relative to the second surface of the substrate with a selectivity of at least 90%.

10. The process of claim 1, wherein the first vapor phase precursor comprising silicon comprises a silane.

11. The process of claim 10, wherein the first vapor phase precursor comprising silicon comprises disilane or trisilane.

12. The process of claim 1, wherein the second vapor phase metal halide precursor comprises a chloride or fluoride.

13. The process of claim 12, wherein the second vapor phase metal halide precursor comprises $TaCl_5$ or $TaF_5$.

14. The process of claim 1, wherein selective deposition comprises the metal silicide selectively depositing on the first substrate relative to the second surface of the substrate with a selectivity of at least 50%.

15. A process for forming a contact structure on a substrate, the process comprising:
provides a substrate comprising a first H-terminated surface and a second oxide, nitride, oxynitride, or carbide surface;
selectively depositing a metal silicide contact layer on the first H-terminated surface of the substrate relative to the second oxide, nitride, oxynitride, or carbide surface by an atomic layer deposition (ALD) process;
wherein the ALD process comprises alternately and sequentially contacting the substrate with a silicon precursor and metal halide precursor, and wherein the metal of the metal halide precursor and the metal of the metal silicide contact layer is one of Ta, Nb, and Ti;
depositing a liner over the metal silicide contact layer; and
depositing a low resistivity material over the metal silicide contact layer and the liner to thereby form a contact structure.

16. The process of claim 15, wherein selectively depositing a metal silicide contact layer comprises selectively depositing until a metal silicide film of a desired thickness is formed.

17. The process of claim 15, further comprising treating at least the first surface of the substrate to provide H-terminations thereon.

18. The process of claim 17, wherein treating at least the first surface of the substrate comprises contacting at least the first surface of the substrate with HF.

19. The process of claim 15, wherein the first surface of the substrate comprises a source/drain region.

20. The process of claim 15, wherein the liner comprises TiN and the low resistivity material comprises W.

21. The process of claim 15, wherein the silicon precursor comprises disilane or trisilane and the metal halide precursor comprises $TaCl_5$ or $TaF_5$.

* * * * *